(12) United States Patent
Jan et al.

(10) Patent No.: US 6,291,762 B1
(45) Date of Patent: Sep. 18, 2001

(54) DUST-PROOF AND WEATHER RESISTANT PHOTOVOLTAIC MODULE AND FABRICATING METHOD THEREOF

(75) Inventors: Yih-Song Jan, Taipei; Jong-Min Liu, Hsinchu; Chih-Chiang Chen, Hsinchu; Lee-Ching Kuo, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/456,640

(22) Filed: Dec. 8, 1999

(51) Int. Cl.[7] .................. H01L 31/042; H01L 31/048
(52) U.S. Cl. .................. 136/256; 136/244; 136/258; 136/260; 136/265; 136/252; 257/435; 257/433
(58) Field of Search .................. 136/244, 256, 136/258 AM, 258 PC, 260, 265, 252; 438/64, 65, 69, 95, 97, 98; 427/74, 165, 168, 169, 380; 257/435, 433

(56) References Cited

U.S. PATENT DOCUMENTS 5,350,644 * 9/1994 Graetzel et al. .................. 429/111
5,939,194 * 8/1999 Hashimoto et al. .............. 428/411.1
6,013,372 * 1/2000 Hayakawa et al. ............... 428/411.1

FOREIGN PATENT DOCUMENTS 9-208273 * 8/1997 (JP) .
9-234344 * 9/1997 (JP) .
10-270732 * 10/1998 (JP) .
11-109523 * 4/1999 (JP) .

* cited by examiner

*Primary Examiner*—Alan Diamond
(74) *Attorney, Agent, or Firm*—Ladas & Parry

(57) ABSTRACT

The present invention discloses a dust-proof and weather resistant photovoltaic module, including (a) a front substrate of light transmittable safety glass plate, wherein a photo-catalyst composition is applied to the safety glass plate; (b) a back substrate of weather resistant polyester polymer; and (c) a photosensitizer including electrical circuit copper foils and polymeric enclosing material (EVA) which is located between the front substrate and the back substrate. The method for fabricating a front substrate of a photovoltaic module includes applying a photo-catalyst composition onto a safety glass plate; evaporating the photo-catalyst composition to a gel; and seating the gel to Rutile titanium dioxide. The photo-catalyst composition includes a metal oxide, an acid regent and a surfactant.

21 Claims, 1 Drawing Sheet

DUST-PROOF AND WEATHER RESISTANT PHOTOVOLTAIC MODULE AND FABRICATING METHOD THEREOF

BACKGROUND OF THE INVENTION

1. Field of the Invention

The present invention relates to photovoltaic modules for converting light into electrical energy. More particularly, the present invention relates to a method of applying a photo-catalyst semiconductor material onto a front substrate of a photovoltaic module, which offers significant advantages in terms of dustproofing and weather resistance.

2. Description of the Related Arts

The world supply of fossil fuels is dwindling, and the combustion of such fossil fuels is environmentally unfriendly; although the nuclear power can meet electricity needs, there are significant issues in terms of the safety of nuclear radiation and storage of the nuclear waste. For these reasons, there is a demand for alternative energy sources with low or no pollution. The photovoltaic module, capable of converting solar energy into eLectricity, is an example of one of such sources.

The application of photovoltaic modu es can be broadly classified as: (1) small-scale consumer products such as calculators, watches and toys etc.; and (2) middle- or large-scale AC/DC power supplies such as beacon lamps, remote telecommunications relays, and auxhliary power supplies of electric network etc. The types of photovoltaic modules can be classified as: (1) single- or polycrystalline silicon photovoltaic modules, which because of the mature technology hold a market share exceeding 75%; (2) novel amorphous silicon photovoltaic modules, which primarily apply to consumer products and have a market share of 10%; and (3) photovoltaic modules produced by other materials, which due to problems in large-area production, remain in the stage of research and development.

The most common structure of a crystalline silicon photovoltaic module consists of 3 major layers, in which the material of each layer is selected based on its function. Generally, the front substrate is a heat-treated safety glass plate, which transmits light, and maintains the integrity and durability of the photovoltaic modules under the operating environment. Beneath the front substrate is a photosensitizer, which is mounted by layers of ethylene vinyl acetate (hereinafter referred as EVA). The EVA possesses the functions of connecting electric circuits, insulating the circuit from electric conductivity and environment, providing appropriate mechanical strength and providing pathways for thermal conducting etc. The back substrate is generally TEDLAR ® (TEDLAR® is a trademark of E.I. Du Pont De Nemours and Company) polymer membrane or glass, which must withstand the rigors of the environment and hydrolysis under such an environment.

It is believed that the soldering of electric circuits onto the electrodes of photovoltaic modules, appropriately enclosing the series or parallel connected photovoltaic modules, and processing the surface of the glass to protect the modules from environment and thus to prolong the life-span thereof, are the keys for increasing the quality and durability of photovoltaic modules.

In the previous technology, titanium dioxide is used in the photosensitizer for promoting the converting efficiency of photovoltaic modules (see, e.g. U.S. Pat. No. 5,350,644). The technique has the following disadvantages: the air pollutants adhere to the surfaces of photovoltaic modules and obstruct the transmittance of light after a period of time, and thus restrict the energy source of photovoltaic modules. Further, titanium dioxide mixed with fluorides resin has been applied to the surfaces of photovoltaic modules. However, the process is more complex, and titanium dioxide may interact with fluorides resin such that the quality of titanium dioxide will be limited, or the adhesion and uniformity of the applied mixture wile be affected (also see, e.g. Japan Patent Nos. 9-313,934A and 10-270,732A).

SUMMARY OF THE INVENTION

It is therefore a primary object of the present invention to provide a photovoltaic module with the advantages of being dustproof and weather resistant, comprising: (a) a front substrate which is a light transmittable safety glass plate, on which a photo-catalyst is applied;

(b) a back substrate which is a weather resistant polyester polymer membrane; and (c) a photosensitizer located between the front substrate and the back substrate, which comprises electrical circuit copper foils and polymeric enclosing material (EVA). The fabricating method of component (a) comprises applying a photo-catalyst semiconductor material onto a safety glass plate; evaporating the photo-catalyst semiconductor material to a gel at 80 to 130° C. for 10 to 40 minutes; and heating the gel to Rutile titanium dioxide at 450 to 600° C. for 50 to 80 minutes, wherein the used photo-catalyst semiconductor material comprises a metal oxide, an acid reagent, and a surfactant. The photovoltaic module of the present invention can overcome the adherence of air pollutants to the surface of the module, and the problems with adhesion and uniformity of the applied photo-catalyst semiconductor material in the prior art described above.

BRIEF DESCRIPTION OF THE FIGURE

The present invention will be more fully understood and further advantages will become apparent when reference is made to the following description of the invention and the accompanying drawings in which.

DETAILED DESCRIPTION OF THE INVENTION

Figure 1:
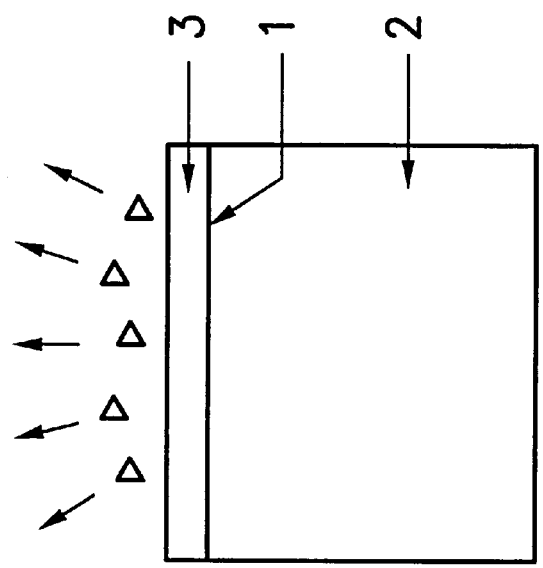
FIG. 1 is a schematic graph showing the mechanism of dustproof and weather resistance of the p:resent invention.
Figure 1:
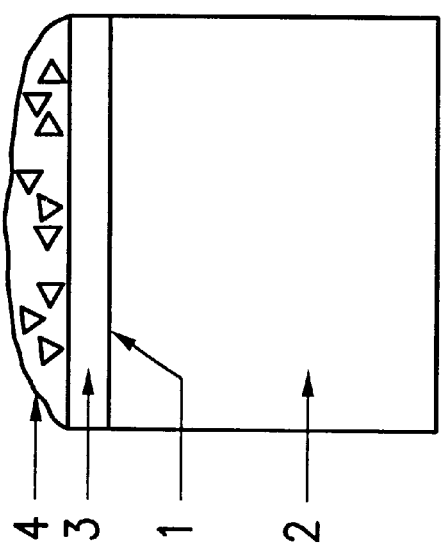

The photo-catalyst semiconductor material is activated after light irradiation, and thus water molecules may be ionized to $OH^-$, which may oxidize the organic pollutants. Therefore, the photo-catalyst semiconductor material applied onto the glass surface will form a hydrophilic layer after light irradiation (as illustrated in Scheme A, below). In this way, organic pollutants such as dust and dirt may flow away and thus the photo-catalyst semiconductor material may present organic pollutants from adhering to the glass surfaces of photovoltaic modules.

Scheme A

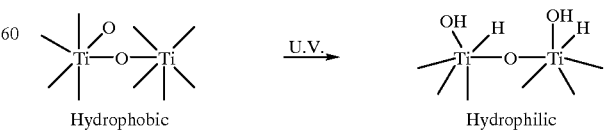

A suitable photo-catalyst semiconductor material should absorb the wavelength of near-visible light but it should not be easily destroyed by the organic pollutants. In addition, it should also not be easily oxidized or evaporated. In this invention, the photo-catalyst semiconductor material is a metal oxide preferably selected from the group consisting of $SnO_2$, $TiO_2$, $ZnO$, $WO_3$, $PbO$, $FeTiO_3$, $SrTiO_3$, $V_2O_5$, $Fe_2O3$, $Bi_2O3$, and the like. Most preferably, the photo-catalyst semiconductor material is $TiO_2$ because it has the advantages of low cost, high chemical stability, non-toxicity and easy activation under the wavelength less than 400 nanometer.

In accordance with the present invention, the photo-catalyst semiconductor material (inorganic titanium compound) applied onto the outer surface of the safety glass plate is subjected to hydrolysis and dehydration at 80 to 130° C. for 10 to 40 minutes, and condensation to form the amorphous titanium dioxide gel in which the silicon dioxide crystals are dispersed. Afterwards, the gel is heated such that the amorphous titanium dioxide is converted into crystalline titanium dioxide. During the heating process, the titanium dioxide will be bound to organic groups and nitrate ligands to form Anatase titanium dioxide when the temperature is elevated to 200 to 350° C.; when continuously heating at 450 to 600° C. for 50 to 80 minutes, the photo-catalyst semiconductor material will be converted into Rutile titanium dioxide, i.e. the effective photo-catalyst semiconductor material of the invention.

Generally, the thickness of titanium dioxide applied on the glass surface ranges from 0.02 to 3.0 micrometer ($\mu$m), and preferably ranges from 0.5 to 2.0 $\mu$m. If the thickness is less than 0.02 $\mu$m, the activity of the photo-catalyst semiconductor material will be decreased. An acid reagent may be added into the photo-catalyst semiconductor material to improve the adherence of photo-catalyst semiconductor material to the surface of the substrate, wherein any acid reagent can be used without degrading the activity of the photo-catalyst semiconductor material. The acid reagent may be an inorganic acid such as HCL, H3PO4, H2SO4, HNO3, and the like. HCL is preferred because it is easily evajor d below 100° C. and removed after being applied. In addition, a n acidified photo-catalyst semiconductor material in which the pH is less than 4 may inhibit the aggregation of titanium dioxide powders. Preferably, the pH is less than 2. A surfactant may be added into the photo-catalyst semiconductor material to decrease the surtace tension and improve the adhesion of the photo-catalyst. Water and all aqueous solutions may be as surfactants. The ratio of the phlo to-catalyst emiconductor material and surfactant ranges from 100:1 (by weight) to 10:1 (by weight), and preferably ranges from 60:1 (by weight) to 40:1 (by weight).

Many organic compounds may be decomposed in titanium dioxide solution under the irradiation of near-UV wavelength or sunlight. Referring to FIG. 1, the photo-catalyst will be removed from aqueous phase of the glass surface 1 of photovoltaic module 2 when the titanium dioxide solution 3 is used in the degradation process. In this way, the purpose of removing organic pollutants 4 on the glass surfaces 1 of photovoltaic modules 2 can oe attended.

Beneath the front substrate is a photosensitizer, which is mounted between layers of EVA. Several requirements of enclosing the photovoltaic modules should be taken into consideration: (1) 30 year life-span; (2) inexpensive material; (3) the light transmittance is not less than 90% at initial stage, and the decline is not higher than 5% over 30 years; (4) the electrical insulation has to withstand DC 3000 volts; (5) the integrity and durability of the module should be maintained under the operative environment; (6) the cost has to meet the economical scale; and (7) the polymeric enclosing material (EVA) has to withstand the outdoor climate and photothermal oxidation and hydrolysis caused by sunlight. Generally, the EVA used herein should be hardened to the extent of 70 to 80% to enhance the mechanical strength and thermal resistance thereof. The thickness of the EVA used herein ranges from 10 to 25 mils, preferably 18 mils.

Accord ng to the present invention, the back substrate of the photovoltaic module is TEDLAR® polymer membrane or glass, which characterized by deflectability and toughness, including TEDLAR®/polyesters/TEDLAR®, TEDLAR®/polyesters/EVA and TEDLAR®/aluminum/ TEDLAR® etc. The thickness of the TEDLAR® polymer membrane or glass used herein rances from 0.5 to 3.0 mils, preferably from 1.0 to 2.0 mils, and the temperature withstood ranges from –72 to 204° C.

The enclosed photovoltaic modules may be framed or not, depending on their intended use, then examined under series of qualification tests and long-term outdoors test. The test standards of crystalline silicon photovoltaic modules include (1) Flat-Plate Photovoltaic Modules and Panels, UL-1703; (2) European Solar Test Installatio:n (ESTI), Qualification Test Procedures for Crystalline Silicon Photovoltaic Modules (CEC JRC ESTI Specification 503); and (3) JIS C-8917. The simple descriptions of these tests are described below:

[1] Standard Output Power: The Standard Test Condition (STC) is 25±5° C. of module temperature, less than 75% R.H., and 1000 W/m² of exposure. The $P_{max}$ obtaired from I-V curve is standard output power.

[2] Insulation Resistance: The resistance is tested using a high resistor under the condition of 25±5° C. of module temperature, less than 75% R.H., and 500 volts applied for 1 minute.

[3] Mechanical Loading Test: 2400 Pa of pressure is exerted upon the front substrate for 1 hour, and the same pressure is exerted upon the back substrate for another 1 hour. Afterwards, the module is tested for Standard Output Power and Insulation Resistance. The module will be qualified if the deviation of Standard Output Power is less than 5% without making change in Insulation Resistance.

[4] Thermal Cycling Test: The test iE performed in a humidi-thermostat at –40° C. for 1 hour and 85° C. for 4 hours. After repeating the test described above for 50 to 200 repetitions, the module is tested for Standard Output Power and Insulation Resistance. The module will be qualified if the deviation of Standard Output Power is less than 5% without making change in Insulation Resistance.

[5] Humidity-Freeze Cycling Test: The test is performed in a humidi-thermostat at –40° C. for 1 hour and 85° C., 85% R.H. for 4 hours. After repeating the test described above for 10 repetitions, the module is tested for Standard Output Power and Insulation Resistance. The module will be qualified if the deviation of Standard Ouput Power is less than 5% without making change in Insulation Resistance.

[6] UV Exposure: The condition is 60±5° C. of module temperature, not higher than 250 W/m² of illuminance, and 15 kW-hr/m² of total illumination. The module is tested for Standard Output Power and Insulation Resistance. The module will be qualified if the deviation of Standard Output Power is less than 5% without making change in Insulation Resistance.

Without intending to limit it in any manner, the present invention will be further illustrated by the following examples.

EXAMPLE 1

The titanium dioxide solution (250 ml of titanium dioxide dissolved in 1000 ml of water) was applied onto a 3.2-mm safety glass plate in a thickness of 1 µm. The glass was then dried in an oven at 100 to 120° C. for 30 minutes and at 500° C. for 1 hour, and next illuminated under 700 W/m² of illuminance for more than 5 hours. The electrical circuits were soldered onto the back electrode, and 12 photovoltaic cells were s eries connected to the front electrode. Then the polymeric enclos ing material (EVA) and TEDLAR® polymer membrane were laminated respectively. The module was subjected to compre ssion molding at 110° C. for 8 to 10 minutes, and then dried in an oven at 150° C. for 10 to 30 minutes. The complete photovoltaic module was placed outdoors for 3 days and examined by the reliability tests described above. The results are shown in Table 1.

COMPARATIVE EXAMPLE 1

The same method for fabricating the crystalline silicon photovoltaic module as EXAMPLE 1 was performed, except that titanium dioxide solution was not applied onto the surface of the safety glass plate. Tqe complete photovoltaic module was placed outdoors for 3 days and examined by the reliability tests described above. The result is shown in Table 1.

TABLE 1

The reliability tests of photovoltaic modules

| Test Item | standard output power (Watt) | Converting efficiency (%) | 200 repetitions of thermal cycling test (loss rate) | 10 repetitions of humidity-freeze cycling test (loss rate) | Mechanical loading test (loss rate) | Insulation resistance (MΩ) | Contact angle (dustproof) |
|---|---|---|---|---|---|---|---|
| Glass surface with $TiO_2$ | 15.2 | 13.2 | 14.7 (3.2%) | 15.0 (1.4%) | 15.2 (<0.1%) | 110 | 0° (dustless) |
| Glass surface without $TiO_2$ | 13.3 | 11.5 | 12.9 (3.2%) | 13.1 (1.5%) | 13.3 (<0.1%) | 109 | 91° (with dust) |

EXAMPLE 2

The same method for fabricating the crystalline silicon photovoltaic module as EXAMPLE 1 was performed. The module was illuminated under 700 W/m² of illuminance for 5 hours, and the contact angle of the glass surface was measured. The result is shown in Table 2.

TABLE 2

The contact angle of the glass surface

| Time (hour) | 0 | 1 | 2 | 3 | 4 | 5 |
|---|---|---|---|---|---|---|
| Glass surface with $TiO_2$ | 91° | 75° | 57° | 30° | 10° | 0° |
| Glass surface without $TiO_2$ | 75° | 75° | 75° | 75° | 75° | 75° |

From Table 2, the contact angle of the glass surface applied with $TiO_2$ decreased from 91° to 0° after 5 hours of illumination, indicating a good moisture on the surface, that is, the photo-catalyst possesses is effectively dustproof after 5 hours of illumination.

Referring the Table 1, the complete photovoltaic module with $TiO_2$ pe aced outdoors for 3 days shows a better output power (15.2 Wants) and converting efficiency (13.2%) than the one without $TiO_2$. The photovoltaic module with $TiO_2$ according to the present invention has a 0° of contact angle showing that no dust adhered onto the glass surface, i.e. it is dustproof, thereby enhancing the output power and converting efficiency of the photovoltaic module. Furthermore, from the data of 200 repetitions of thermal cycling test, 10 repetitions of humidity-freeze cycling test, mech a nical loading test and insulation resistance test demonstrate that the photovoltaic module of the present invention has a high reliability and stabtity.

While the invenion has been particularly shown and described with the reference to the preferred embodiment thereof, it will be understood by those skilled in the art that various changes in form and details may be made without departing from the spirit and scope of the invention.

What is claimed is:

1. A dustproof and weather resistant photovoltaic module, comprising:
   a front substrate of light transmittable safety glass plate, wherein a photo-catalyst semiconductor material is applied to said safety glass plate;
   a back substrate of weather resistant polyester polymer; and
   a photosensitizer having electrical circuit copper foils and polymeric enclosing material, which is located between said front substrate and said back substrate.

2. The photovoltaic module as claimed in claim 1, wherein said photo-catalyst semiconductor material comprises:
   a metal oxide;
   an acid reagent; and
   a surfactant.

3. The photovoltaic module as claimed in claim 2, wherein said metal oxide is selected from the grroup consisting of $SnO_2$, $TiO_2$, ZnO, $WO_3$, PbO, $FeTiO_3$, $SrTiO_3$, $V_2O_5$, $Fe_2O_3$, and $Bi_2O_3$.

4. The photovoltaic module as claimed in claim 2, wherein the applied thickness of said photo-catalyst semiconductor material is less than 5 µm.

5. The photovoltaic module as claimed in claim 4, wherein the applied thickness of said photo-catalyst semiconductor material ranges from 0.5 to 2 µm.

6. The photovoltaic module as claimed in claim 2, wherein said acid reagent is an inorganic acid.

7. The photovoltaic module as claimed in claim 6, wherein said acid reagent is HCl.

8. The photovoltaic module as claimed in claim 2, wherein the pH of said photo-catalyst semiconductor material is less than 4.

9. The photovoltaic module as claimed in claim 2, wherein the pH of said photo-catalyst semiconductor material is less than 2.

10. The photovoltaic module as claimed in claim 2, wherein said surfactant is selected from the group consisting of water and all aqueous solutions.

11. The photovoltaic module as claimed in claim 2, wherein the ratio of the photo-catalyst semiconductor material and surfactant ranges from 100:1 by weight to 10:1 by weight.

12. The photovoltaic module as claimed in claim 2, wherein the ratio of the photo-catalyst semiconductor material and surfactant ranges from 60:1 by weight to 40:1 by weigt.

13. The photovoltaic module as claimed in claim 1, wherein the thickness of said polymeric enclosing material ranges fromi 10 to 25 mils.

14. The photovoltaic module as claimed in claim 13, wherein the thickness of said polymeric enclosing material is 18 mils.

15. The photovoltaic module as claimed in claim 1, wherein the thickness of said polyester polymer ranges from 0.5 to 3.0 mils.

16. The photovoltaic module as claimed in claim 1, wherein the temperature resistance of said polyester polymer ranges from −72 to 204° C.

17. The photovoltaic module as claimed in claim 1, wherein the converting efficiency of the photovoltaic module is higher than 13%.

18. The photovoltaic module as claimed in claim 1, wherein the standard output power of the photovoltaic module is highr than 15 Watts.

19. The photovoltaic module as claimed in claim 1, wherein said polymeric enclosing material is ethylene vinyl acetate (EVA).

20. The photovoltaic module as claimed in claim 13, wherein said polymeric enclosing material is ethylene vinyl acetate (EVA).

21. The photovoltaic module as claimed in claim 14, wherein said polymeric enclosing material is ethylene vinyl acetate (EVA).

* * * * *